United States Patent

Yoshida et al.

[11] Patent Number: 5,006,218
[45] Date of Patent: Apr. 9, 1991

[54] SPUTTERING APPARATUS

[75] Inventors: Yoshikazu Yoshida, Izumi; Kunio Tanaka, Toyonaka, both of Japan

[73] Assignee: Matsushita Electric Industrial Co., Ltd., Osaka, Japan

[21] Appl. No.: 556,002

[22] Filed: Jul. 16, 1990

[30] Foreign Application Priority Data

Jul. 20, 1989 [JP] Japan .................. 1-187849

[51] Int. Cl.$^5$ .......................... C23C 14/34
[52] U.S. Cl. .................. 204/298.06; 204/298.07; 204/298.15; 204/298.16; 204/298.19
[58] Field of Search ............ 204/192.12, 298.06, 204/298.07, 298.15, 298.16, 298.19

[56] References Cited

U.S. PATENT DOCUMENTS 4,038,171  7/1977  Moss et al. ............ 204/298.06
4,627,904  12/1986  Mintz ................ 204/298.06
4,818,359  4/1989  Jones et al. ............ 204/298.06

Primary Examiner—Nam X. Nguyen
Attorney, Agent, or Firm—Wenderoth, Lind & Ponack

[57] ABSTRACT

A sputtering apparatus includes: a discharge chamber having four curved side surfaces protruding toward a center of the chamber to form a discharge space surrounded by the side surfaces therein; a gas inlet and a gas outlet each formed at the chamber; cylindrical cathodes; plural permanent magnets arranged outside each of the side surfaces of the chamber; a sputtering electrode arranged at the space surrounded by the curved side surfaces; and a bed for holding a substrate, which is arranged in the chamber and opposed to the sputtering electrode. Each of the cathodes is arranged between the adjacent curved side surfaces of the chamber. A negative electric potential is applied to each of the cathodes. The adjacent permanent magnets have different magnetic poles to each other. The surface of substrate held by the bed is parallel to the opposed surface of the sputtering electrode, and the surfaces of the substrate and the electrode are arranged crossing the curved side surfaces.

6 Claims, 4 Drawing Sheets

SPUTTERING APPARATUS

BACKGROUND OF THE INVENTION

The present invention relates to a sputtering apparatus for forming a thin film in semiconductor process techniques or surface treatment techniques.

There have been proposed these kinds of high-speed sputtering apparatuses.

FIG. 4 shows the construction of one of the apparatuses. Reference numeral 1 denotes a vacuum chamber, 2 a target arranged in the chamber 1, 3 a magnetic field parallel to the target 2, 4 permanent magnets for generating the magnetic field 3, 5 a substrate holder arranged to oppose to the target 2, 6 an electric field perpendicularly to the magnetic field 3, 7 a power supply for generating the electric field 6, 8 a gas introducing into the chamber 1 for generating a plasma, 9 a substrate fixedly held on the holder 5, and 10 a yoke constituting a magnetic circuit of the permanent magnets 4.

According to the construction of the apparatus, the magnetic field 4 parallel to the surface of the target 2 is made near the surface of the target 2 by the permanent magnet 4. Between the target 2 and the substrate 5, the electric field 6 perpendicularly to the magnetic field 3 is made by the supply 7. By the magnetic field 3 and the electric field 6, electrons in a discharge region are caught by a space charge so as to perform magnetron discharge through the gas 8. The increase of plasma density near the target 2 by the permanent magnets 4 causes higher sputter rate, thus forming a thin film at high speed.

In the construction of the apparatus, however, an unusual magnetic gap is utilized by using leakage magnetic field as the construction of magnets, thus making the weak and non-uniform magnetic field 3. Therefore, the sputtering is performed at insufficient sputter rate and a part of the target 2 is greatly consumed, thus forming non-uniform stacked films.

SUMMARY OF THE INVENTION

Accordingly, an essential object of the present invention is to provide a sputtering apparatus which has two pairs of cathodes, one of which is arranged at a portion between adjacent curved side surfaces, of a discharge chamber, protruding toward the center of the chamber and by permanent magnets arranged along each curved side surface of the chamber and arranged between the adjacent cathodes, an magnetic field for PIG, Penning Ionization Gauge, discharge is applied to a substrate along the curvature of the side surface, thus forming a uniform plasma for sputtering on a large area in the chamber.

In accomplishing these and other objects, according to one aspect of the present invention, there is provided a sputtering apparatus comprising:

a discharge chamber having four curved side surfaces protruding toward a center of the chamber to form a discharge space surrounded by the side surfaces therein;

a gas inlet and a gas outlet each formed at the chamber;

cylindrical cathodes, each of which is arranged between the adjacent curved side surfaces of the chamber, to which a negative electric potential is applied;

plural permanent magnets arranged outside each of the side surfaces of the chamber, the adjacent permanent magnets having different magnetic poles to each other;

a sputtering electrode arranged at the space surrounded by the curved side surfaces; and a bed for holding a substrate, which is arranged in the chamber and opposed to the sputtering electrode, a surface of the substrate held by the bed being parallel to an opposed surface of the sputtering electrode, the surfaces of the substrate and the electrode arranged being perpendicular to the curved side surfaces.

By the above construction of one aspect of the present invention, by combination of a cusped magnetic field formed by the permanent magnets, and an electric field formed by the two pairs of cathodes and the side surfaces of the chamber, PIG discharge can be certainly accomplished in a large space in the chamber, thus trapping electrons in the space and forming a plasma with high density on a large area in the chamber. As a result of that, as compared to the proposed apparatus in FIG. 4 in which a high density plasma is concentrated on a part of the target, the plasma with high density can be emitted on the whole surface of the target.

According to another aspect of the present invention, there is provided the sputtering apparatus, described above, further comprising means for emitting a microwave in the space of the chamber.

By the above construction of another aspect of the present invention, the combination of the PIG discharge and the microwave discharge can certainly cause the discharge irrespective of the surface state of the electrode.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
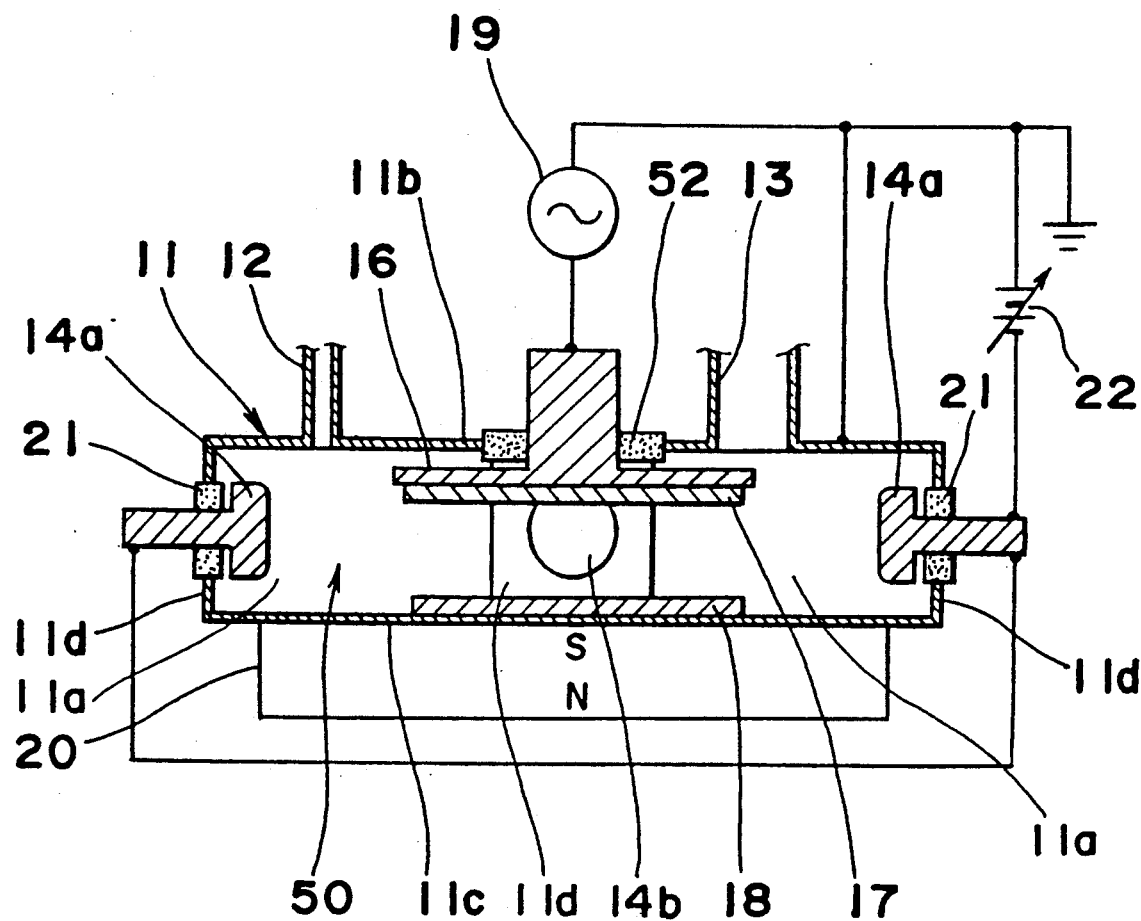
FIG. 1 is a longitudinal sectional view of a sputtering apparatus according to a first embodiment of the present invention.

Before the description of the present invention proceeds, it is to be noted that like parts are designated by like reference numerals throughout the accompanying drawings.

Figure 2:
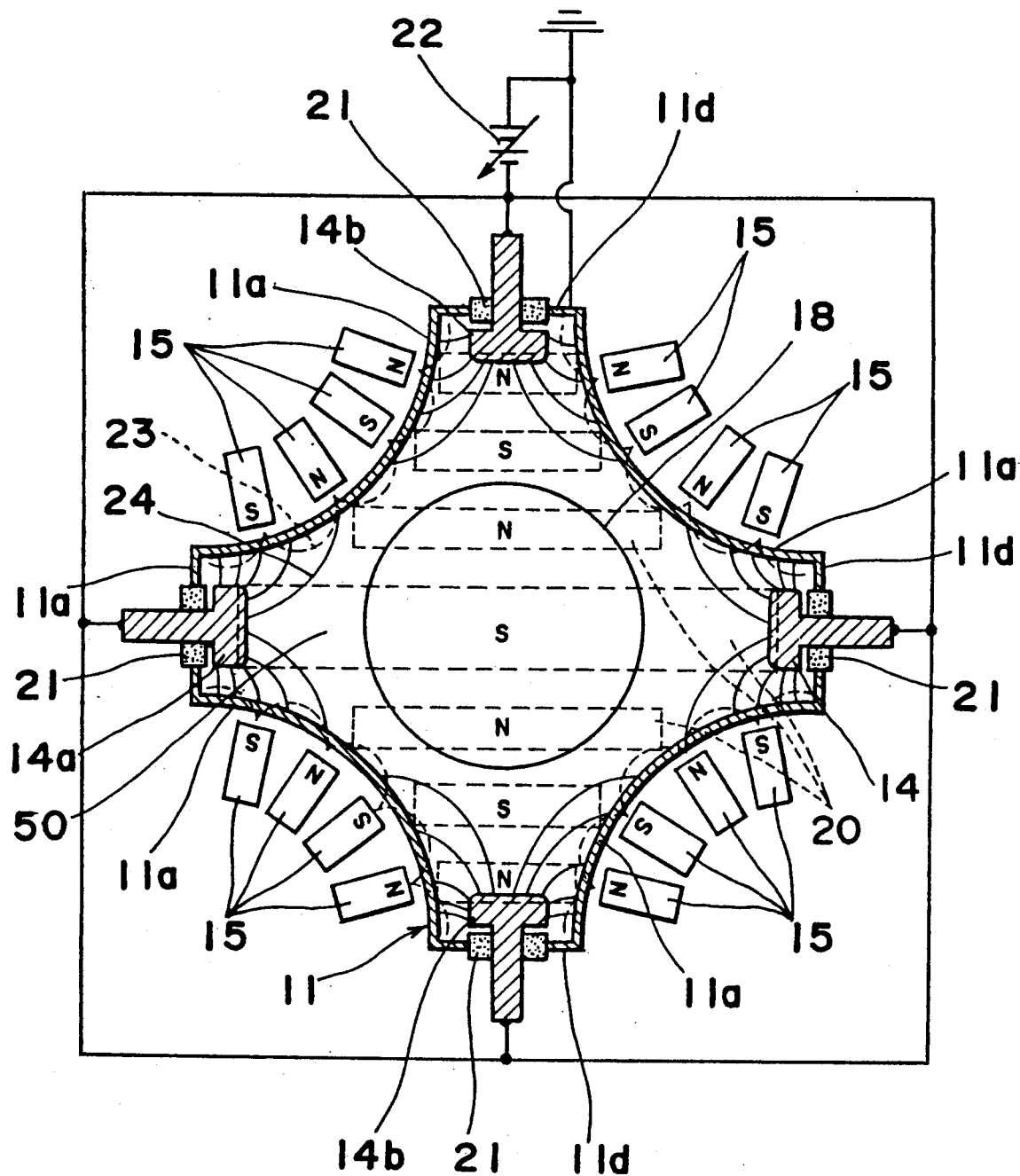
FIG. 2 is a cross-sectional view of the apparatus shown in FIG. 1.

FIGS. 1 and 2 show a sputtering apparatus according to a first embodiment of the present invention. Reference numeral 11 denotes a discharge chamber constructed so that four adjacent side surfaces of a square chamber are protruded toward the center of the square chamber and then each of the protruded side walls 11a thereof is curved. The chamber 11 has a gas inlet 12 and a gas outlet 13 at the upper wall 11b thereof. The gas inlet 12 and the gas outlet 13 are arranged connecting to a space 50 surrounded by the four curved side walls 11a and the upper wall 11b and the lower wall 11c of the chamber 11. Reference numeral 14a and 14b denote two pairs of cylindrical cathodes arranged at plane side walls 11d between the ends of the adjacent curved side walls 11a of the chamber 11, where the curvatures of the adjacent curved side surfaces come adjacent to each other. Plural first permanent magnets 15 are arranged outside each of the curved side walls 11a and along the curved outer surface of each curved side wall 11a. The adjacent first permanent magnets 15 have different magnetic poles from each other. A sputtering electrode 16 is arranged near the inside of the upper wall 11b of the chamber 11 through an electrical porcelain 52. A target 17 is arranged on the lower surface of the electrode 16. A substrate 18 on which a thin film is to be form by sputtering is arranged on the lower wall 11c of the chamber 11, opposing the target 17. A high frequency is applied to the target 17 by a power supply 19 for high frequency. Plural second permanent magnets 20 are arranged under and outside the lower wall 11c of the chamber 11 to provide magnetic fields for applying to the substrate 18. The adjacent second permanent magnets 20 have different magnetic poles from each other. Reference numeral 21 denotes an electrical porcelain arranged between each of the cathodes 14a and 14b and each of the plane side walls 11d.

According to the construction of the apparatus, each of the cathodes 14a and 14b is electrically insulated from the walls of the chamber 11 through the electrical porcelain 21. A voltage of $-200$ volts is applied to the cathodes 14a and 14b by a power supply 22, whereas the walls of the chamber 11 are grounded. Then, gas such as argon is introduced through the gas inlet 12 into the chamber 11, and then the chamber 11 is filled with the gas of the order of $10^{-3}$–$10^{-2}$ Torr. Cusped magnetic fields 23 are formed at the side walls 11a and the lower wall 11c of the chamber 11 by the permanent magnets 15 and 20, respectively. Ionized electrons are trapped in the chamber 11 by the cusped magnetic fields 23 and electric fields 24. Thus, the ionized electrons can be utilized for plasma production until the energy of each electron is consumed by collision with particles without diffusing along the surface of the walls of the chamber 11. At this time, an RF power of 100 W is applied to the target 17, and then a thin film of the components of the target 17 is formed on the surface of the substrate 18 by sputtering using ions in the plasma.

According to the construction of the first embodiment of the present invention, by combination of the cusped magnetic fields 23 using the permanent magnets 15 and 20, the two pairs of cathodes 14a and 14b, and the electrode 16, PIG discharge can be certainly accomplished, thus forming plasma with high density of $10^{11}$ cm$^{-3}$ on the whole surface of the target 17 in the chamber 11.

Next, a sputtering apparatus according to a second embodiment of the present invention will be described hereinafter.

Figure 3:
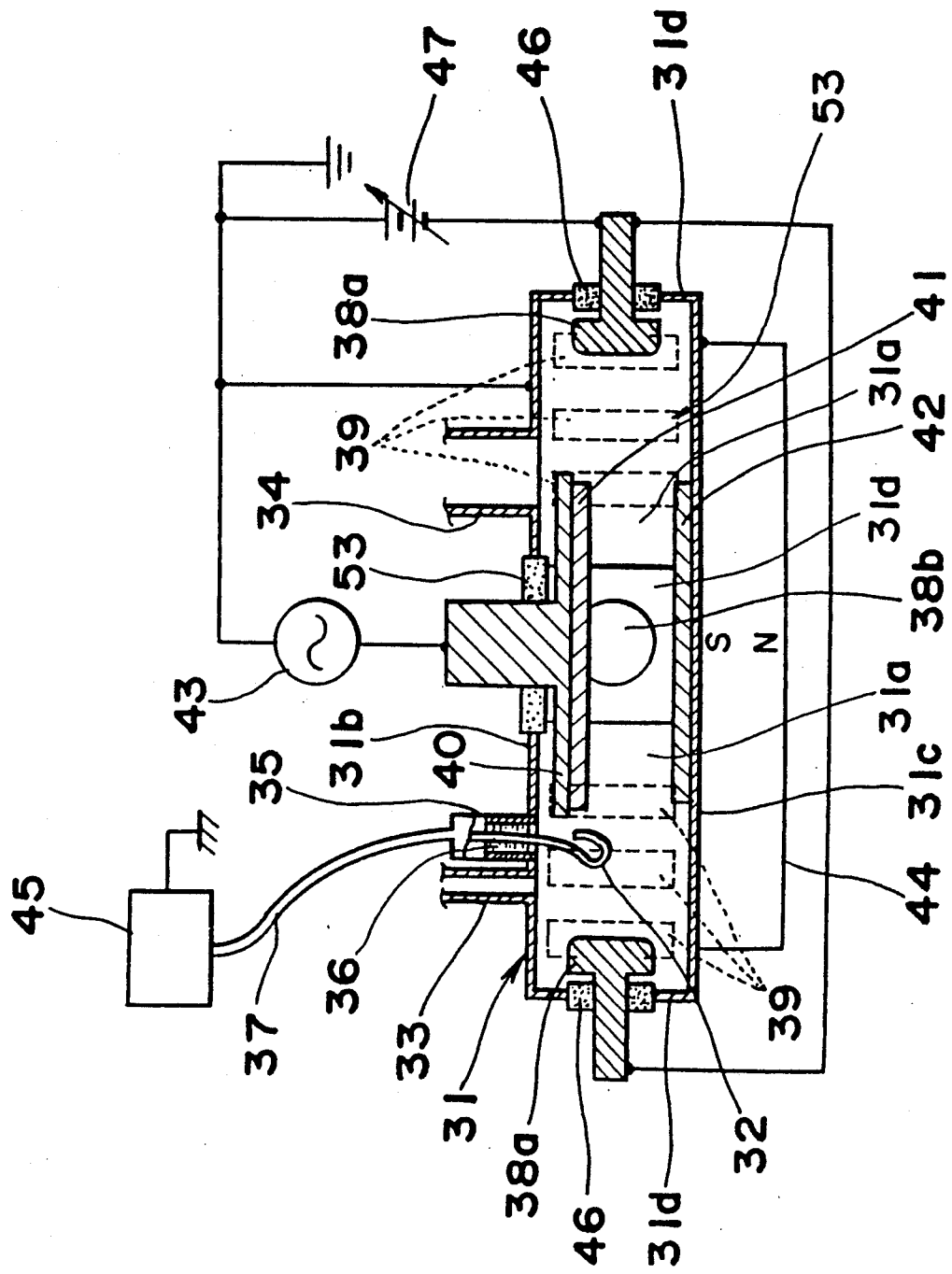
FIG. 3 is a longitudinal sectional view of a sputtering apparatus according to a second embodiment of the present invention.
Figure 4:
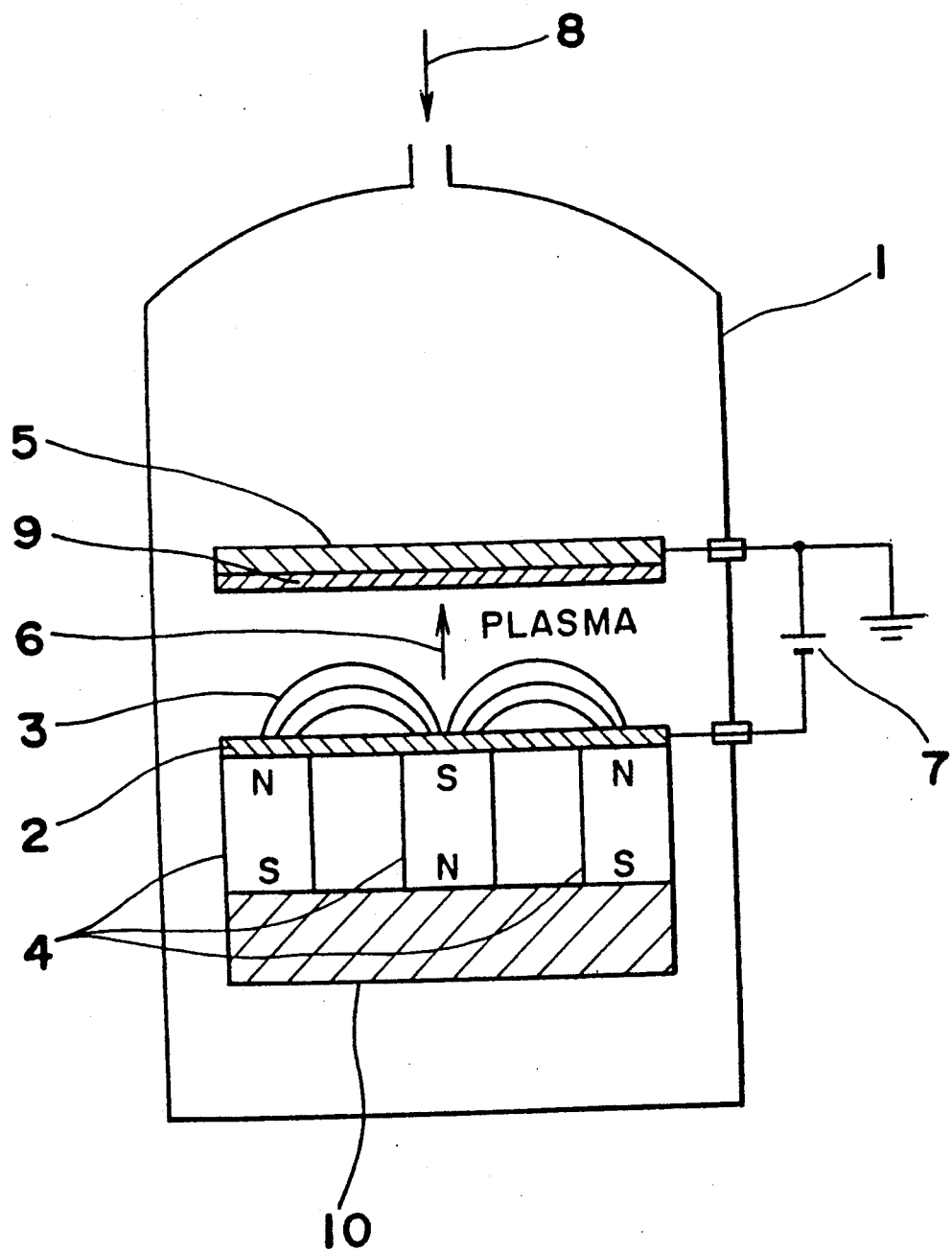
FIG. 4 is a longitudinal sectional view of a sputtering apparatus which has proposed.

FIG. 3 shows the apparatus according to the second embodiment. The difference between the first and second embodiments is that an antenna 32 is arranged for radiating microwaves in a discharge chamber 31. The chamber 31 has four side walls 31a (not clearly shown, but similarly to the curved side walls 11a of the chamber 11 in FIG. 2) constructed so that four side surfaces of a square chamber are protruded toward the center of the square chamber and then each of the protruded side walls 31a thereof is curved. The chamber 31 has a gas inlet 33 and a gas outlet 34, both connecting to a space 55 surrounded by the four curved side walls and the upper wall 31b and the lower wall 31c of the chamber 31. The chamber 31 also has a connector 35 for inserting the antenna 32 in the chamber 31 at the upper wall 31b thereof. The connector 35 has a coaxial line 37 supported by an insulator 36 at the middle thereof. The line 37 electrically connects with the ring-shaped antenna 32 in the chamber 31. Two pairs of cylindrical cathodes 38a and 38b are arranged at plane side walls 31d (similarly to the plane side walls 11d of the chamber 11 in FIG. 2) between the ends of the adjacent curved side walls of the chamber 31, where the curvatures of the adjacent curved side surfaces come adjacent to each other. Plural first permanent magnets 39 are arranged outside each of the curved side walls 31a and along the curved outer surface of each curved side wall 31a. The adjacent first permanent magnets 39 have different magnetic poles from each other. A sputtering electrode 40 is arranged near the inside of the upper wall 31b of the chamber 31 through an electrical porcelain 53. A target 41 is arranged on the lower surface of the electrode 40. A substrate 42 on which a thin film is to be formed by sputtering is arranged on the lower wall 31c of the chamber 31, opposing the target 41. A high frequency is applied to the target 41 by a power supply 43 for high frequency. Plural second permanent magnets 44 are arranged under and outside the lower wall 31c of the chamber 31 to provide magnetic fields for applying to the substrate 42. The adjacent second permanent magnets 44 have different magnetic poles from each other. Reference numeral 46 denotes an electrical porcelain arranged between each of the cathodes 38a and 38b and each of the plane side walls 31d. Reference numeral 45 denotes a power supply for microwave.

According to the construction of the apparatus, gas such as argon is introduced through the gas inlet 33, into the chamber 31 and then the chamber 31 is filled with the gas of the order of $10^{-4}$–$10^{-3}$ Torr. At this time, a microwave of 100 W is emitted in the chamber 31 from the antenna 32 by the power supply 45, thus starting the discharge. Next, a voltage of $-200$ volts is applied by the power supply 47 to the cathodes 38a and 38b electrically insulated against the walls of the chamber 31 through the electrical porcelains 46. At this time, in a case where the walls of the chamber 31 are grounded, plasma can be trapped in the chamber 31 by action of electric fields and magnetic fields. Thus, high density plasma of $10^{11}$–$10^{12}$ plasma particles per unit cm$^3$ can be certainly maintained in the chamber 31 by the microwave even though the gas has lower pressure. At this time, an RF power of 100 W is applied to the target 41, and then a thin film including the components of the target 41 is formed on the surface of the substrate 42 by sputtering using ions in the plasma.

According to the construction of the second embodiment of the present invention, the combination of the PIG discharge and the microwave discharge certainly causes the sputtering even though the gas pressure is of the order of $10^{-4}$ Torr.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sputtering apparatus comprising:
   a discharge chamber having four adjacent curved side surfaces protruding toward a center of said chamber to form a discharge space surrounded by the side surfaces therein;
   a gas inlet and a gas outlet each formed in said chamber;
   cylindrical cathodes, each of which is arranged between the adjacent curved side surfaces of said chamber, to which a negative electric potential is applied;
   plural adjacent permanent magnets arranged outside each of the side surfaces of said chamber, said adjacent permanent magnets having different magnetic poles from each other;
   a sputtering electrode having a target arranged on a lower surface of the sputtering electrode arranged in the space surrounded by the adjacent curved side surfaces; and
   a bed for holding a substrate, having a surface said bed being arranged in said chamber and opposed to said sputtering electrode, a surface of the substrate held by said bed being parallel to an opposed surface of said sputtering electrode, the surfaces of the substrate and said electrode being perpendicular to the adjacent curved side surfaces.

2. A sputtering apparatus as claimed in claim 1, further comprising plural adjacent permanent magnets arranged under said bed and outside said chamber, said adjacent permanent magnets having different magnetic poles from each other.

3. A sputtering apparatus as claimed in claim 1, further comprising means for applying a high frequency to said sputtering electrode.

4. A sputtering apparatus as claimed in claim 1, further comprising means for applying to said sputtering electrode an electric potential negative with respect to said chamber.

5. A sputtering apparatus as claimed in claim 1, further comprising means for radiating a microwave in the space of said chamber.

6. A sputtering apparatus as claimed in claim 5, wherein said means for radiating the microwave has an antenna projecting into the space of said chamber.

* * * * *